(12) United States Patent
Nakabeppu

(10) Patent No.: US 6,357,138 B2
(45) Date of Patent: Mar. 19, 2002

(54) DRYING APPARATUS AND METHOD (75) Inventor: Kenichi Nakabeppu, Tokyo (JP)

(73) Assignee: NEC Corporation (JP)

(*) Notice: Subject to any disclaimer, the term of this patent is extended or adjusted under 35 U.S.C. 154(b) by 0 days.

(21) Appl. No.: 09/827,857

(22) Filed: Apr. 6, 2001

(30) Foreign Application Priority Data

Apr. 10, 2000 (JP) .......................................... 12-108490

(51) Int. Cl.$^7$ ................................................ F26B 21/06
(52) U.S. Cl. ............................. 34/72; 34/340; 34/329; 34/443; 34/447
(58) Field of Search .......................... 34/307, 329, 330, 34/337, 340, 443, 445, 447, 524, 72; 432/5, 6, 253, 258

(56) References Cited

U.S. PATENT DOCUMENTS

| 3,710,450 A | * | 1/1973 | Figiel ................................ 34/9 |
| 4,355,974 A | * | 10/1982 | Lee ............................. 432/253 |
| 4,669,612 A | * | 6/1987 | Mortensen ................... 206/454 |
| 4,981,222 A | * | 1/1991 | Lee ............................... 211/41 |
| 5,089,084 A | * | 2/1992 | Chhabra et al. ............. 156/646 |
| 5,111,936 A | * | 5/1992 | Kos ............................. 206/334 |
| 5,298,966 A | * | 3/1994 | Berman ........................ 356/154 |
| 5,341,825 A | * | 8/1994 | Kobayashi ..................... 134/61 |
| 5,709,037 A | * | 1/1998 | Tanaka et al. ................. 34/330 |
| 5,807,439 A | * | 9/1998 | Akatsu et al. ................. 134/32 |
| 6,139,645 A | * | 10/2000 | Leenaars et al. ............... 134/30 |
| 6,165,277 A | * | 12/2000 | Florez ............................ 134/2 |
| 6,279,724 B1 | * | 8/2001 | Davis ....................... 198/465.2 |

* cited by examiner

Primary Examiner—Denise L. Esquivel
Assistant Examiner—K. B. Rinehart
(74) Attorney, Agent, or Firm—Ostrolenk, Faber, Gerb & Soffen, LLP (57) ABSTRACT A tank stores a drying liquid for drying a semiconductor wafer. A boat vertically holds a plurality of target semiconductor wafers to be dried. The semiconductor wafers which are held by the boat are entirely soaked in the drying liquid. After this, the semiconductor wafers are lifted from the drying liquid at a rate in a range from 1 to 3 mm/min, so as to be dried. At this time, the surface of the drying liquid is divided with using a dividing liquid at each side of the semiconductor wafer. The dividing plate divides the surface of the drying liquid, thereby to prevent particles, which are once removed from the semiconductor wafer, from being again adhered onto the semiconductor wafer.

13 Claims, 10 Drawing Sheets

DRYING APPARATUS AND METHOD

BACKGROUND OF THE INVENTION

1. Field of the Invention

The present invention relates to a drying apparatus and method for drying a semiconductor wafer after being cleaned.

2. Description of the Related Art

There are various methods for drying semiconductor wafers after being cleaned using a cleaning solution.

In a spin-drying method for drying a plurality of semiconductor wafers by rotating the plurality of semiconductor wafers at a high speed, a problem arises in that the larger the diameter of each semiconductor wafer, the larger the size of the drying apparatus, and the more expensive the cost of the drying apparatus.

In order to avoid the above problem, there is proposed a method for drying semiconductor wafers using isopropyl alcohol (IPA). One example of such a method is disclosed in U.S. Pat. No. 5,653,045.

According to the technique disclosed in U.S. Pat. No. 5,653,045, target semiconductor wafers to be dried are soaked in pure water which is stored in a tank. After this, the IPA is jetted into the tank, thereby to form a thin IPA film on the surface of the pure water.

Thereafter, the semiconductor wafers are taken out from the pure water at a low speed. At the time when the semiconductor wafers pass the IPA film, the moisture on the surface of each semiconductor wafer is removed as a result of a Marangoni-flow effect.

When to take out the semiconductor wafers from the pure water, the concentration of the IPA is high around each of the semiconductor wafers and is low away from each of the semiconductor wafers. That is, the surface tension of the IPA is low around each of the semiconductor wafers and high away from each of the semiconductor wafers. In the circumstances where there is a difference in the levels of the surface tension, Marangoni flow occurs.

Figure 8:
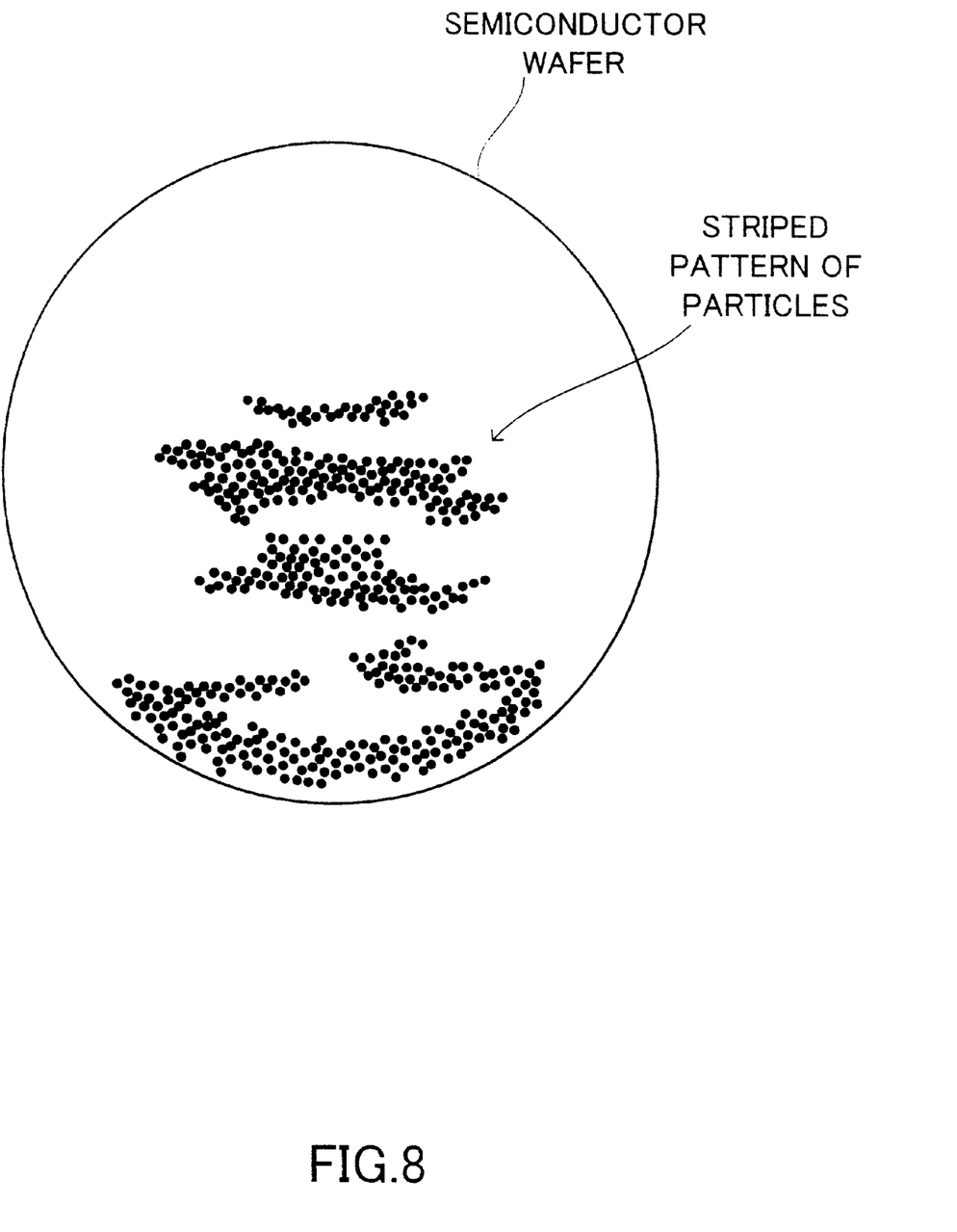
FIG. 8 is a diagram showing the surface of a semiconductor wafer which is dried using a conventional drying apparatus.

Kazumi Asada et al. reports, in "A New Economical Wafer Drying Technology with High Process Performance", IEEE International Symposium on Semiconductor Manufacturing Conference Proceedings, (1997), that, in the drying method applying a Marangoni-flow effect, a striped pattern of particles is formed on the surface of each of the semiconductor wafers, as shown in FIG. 8.

Such particles interfere with formation of wiring having a predetermined pattern, and causes a short circuit in the wiring forming on each semiconductor wafer. In such context, a problem is that the yield and reliability of those parts to be manufactured using the semiconductor wafer, which has been dried using the method with the Marangoni-flow effect, are low.

The entire contents of the above publication and reference are incorporated herein by reference.

SUMMARY OF THE INVENTION

It is accordingly an object of the present invention to provide a drying apparatus and method for drying a semiconductor wafer while preventing particles from being adhered onto the semiconductor wafer.

In order to achieve the above object, according to the first aspect of the present invention, there is provided a drying apparatus comprising:

a tank which stores a drying liquid for drying a target semiconductor wafer to be dried;

a holder which holds the semiconductor wafer, perpendicular to a surface of the drying liquid;

a dryer which soaks the semiconductor wafer in the drying liquid, and takes out the semiconductor wafer from the drying liquid, thereby to dry the semiconductor wafer; and a divider which divides the surface of the drying liquid on each side of the semiconductor wafer, thereby to protect an impurity removed from the semiconductor wafer to be adhered again onto the semiconductor wafer.

According to this invention, the semiconductor wafer can be dried, while particles are prevented from being adhered onto the semiconductor wafer.

The dryer may lift and lower the holder, thereby to soak and takes out the semiconductor wafer in and from the drying liquid.

The dryer may lift the holder at a rate in a range from 1 to 3 mm/min.

The divider may include a plurality of plates, each of which is formed of polytetrafluoroethylene, for dividing the surface of the drying liquid.

The dryer may discharge the drying liquid from the tank so as to take out the semiconductor wafer from the drying liquid; and the divider may float on the drying liquid, and may move downward along with a downward movement of the surface of the drying liquid.

The divider may comprise at least one plate for dividing the surface of the drying liquid and a holding member for holding the at least one plate; and the holding member may have such specific gravity that a top end of the at least one plate protrudes from the drying liquid.

The dryer may include a valve for adjusting a discharge amount of the drying liquid to be discharged, and lower the surface of the drying liquid at a rate in a range from 1 to 3 mm/min.

The at least one plate may be formed of polytetrafluoroethylene.

In order to achieve the above object, according to the second aspect of the present invention, there is provided a method for drying an object, comprising:

soaking a semiconductor wafer, perpendicular to a surface of a drying liquid, in the drying liquid which is stored in a tank and for drying the semiconductor wafer;

drying the semiconductor wafer by taking out the semiconductor wafer from the drying liquid; and preventing particles, which are removed once from the semiconductor wafer, from being again adhered onto the semiconductor wafer, by dividing the surface of the drying liquid at each side of the semiconductor wafer when to take out the semiconductor wafer from the drying liquid.

The drying may include taking out the semiconductor wafer from the drying liquid by lifting the semiconductor wafer.

The drying may include lifting the semiconductor wafer at a rate in a range from 1 to 3 mm/min.

The drying may include taking out the semiconductor wafer from the drying liquid, by discharging the drying liquid from the tank; and the preventing may include dividing the surface of the drying liquid with using at least one plate, which moves downward along with a downward movement of the surface of the drying liquid.

The drying may include lowering the surface of the drying liquid at a range in a range from 1 to 3 mm/min, by adjusting a discharge amount of the drying liquid.

BRIEF DESCRIPTION OF THE DRAWINGS

The object and other objects and advantages of the present invention will become more apparent upon reading of the following detailed description and the accompanying drawings in which.

DETAILED DESCRIPTION OF THE PREFERRED EMBODIMENTS

A drying apparatus according to the first embodiment of the present invention will now be described with reference to the accompanying drawings.

Figure 1:
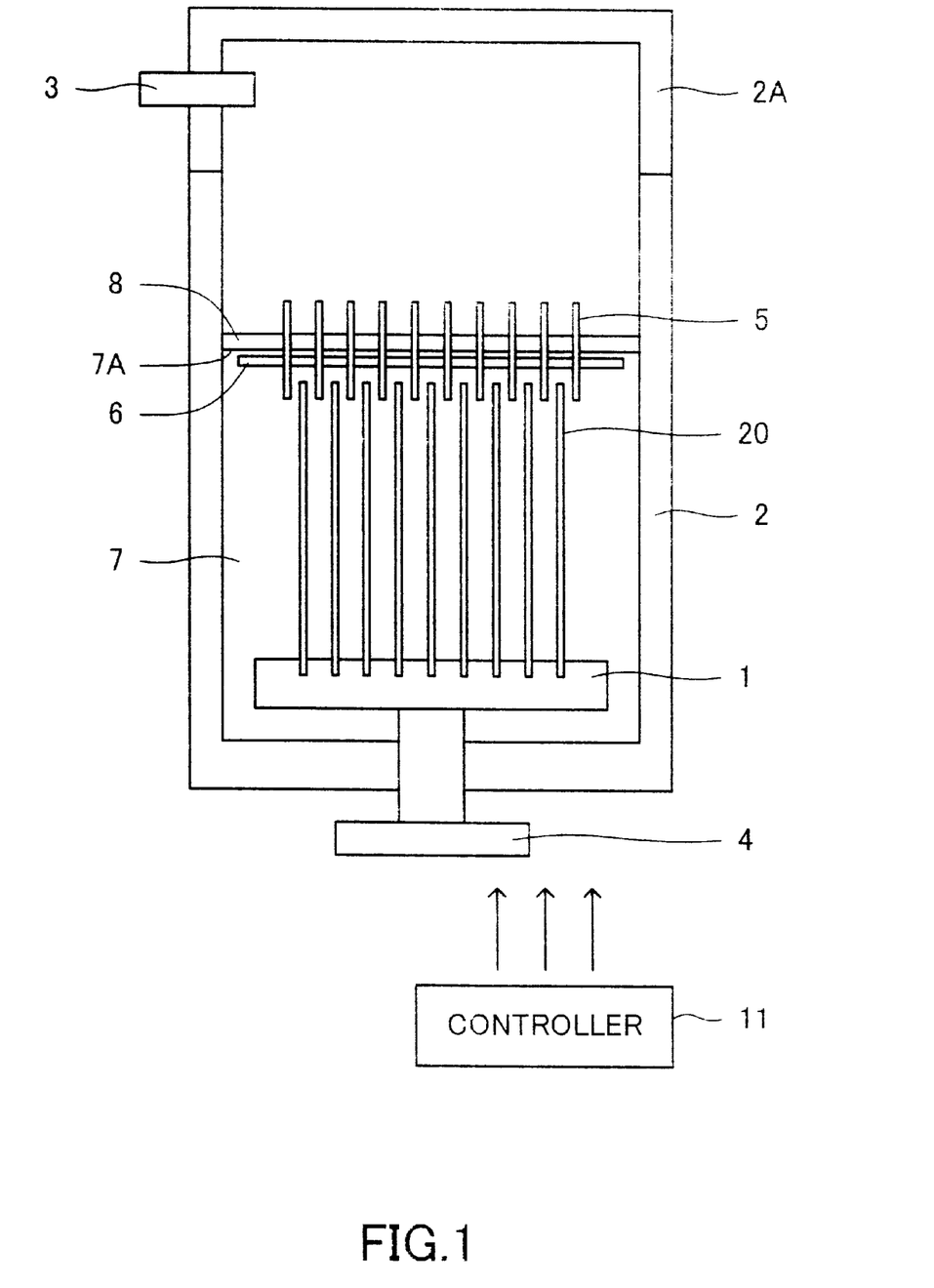
FIG. 1 is a diagram showing the structure of a drying apparatus according to the first embodiment of the present invention.

The drying apparatus according to the first embodiment comprises, as illustrated in FIG. 1, a boat 1, a tank 2, a supply nozzle 3, a lifter 4, dividing plates 5, a pole 6, and a controller 1. In this structure, the drying apparatus dries wafers (semiconductor wafers) 20 which have been cleaned.

The boat 1 is prepared to vertically holds a plurality of wafers 20.

The tank 2 stores pure water 7. The tank 2 has a lid 2A for closing the tank 2 up in an airtight manner.

The supply nozzle 3 is arranged on the lid 2A. The supply nozzle 3 supplies isopropyl alcohol (EPA) with a carrier gas such as nitrogen, etc. to the tank 2 storing the pure water 7. As a result of this, a thin IPA film 8 is formed over the surface of the pure water 7.

The moisture on the surface of the wafers 20 is removed therefrom, when the wafers 20 are taken out from the pure water 7 through the IPA film 8.

The lifter 4 is arranged on the bottom of the tank 2, and moves the boat 1 upward and downward inside the tank 2.

The dividing plates 5 are arranged parallel to the wafers, on each side of the wafers. The dividing plates 5 keep the impurities (particles, etc.) travelling in the IPA film 8 from being adhered onto the wafers 20. The impurities are those which have remained on the wafers 20 and removed therefrom, when the wafers 20 are soaked into the pure water 7. Each of the dividing plates 5 divides the IPA film 8 on each side of each wafer 20, thereby to trap the impurities which have removed from one of the wafers 20, and to protect another wafer 20 which is arranged next to the one of the wafers 20 from such impurities. To realize such a technique for protecting the wafers 20, the tank 2 is filled with the pure water 7 whose surface 7A is set to a position where the dividing plates 5 are arranged. The height of the dividing plates 5 is set greater than a movement distance of the surface 7A moving as a result of the lifting of the boat 1.

The pole 6 is fixed on the side wall of the tank 2, and holds the dividing plates 5 without interfering with the movement of the boat 1 and wafers 20.

The controller 11 controls the operations of each of the above sections forming the structure of the drying apparatus, in accordance with a predetermined program and data.

Operations of the drying apparatus having the above structure will now be explained.

The target wafers 20 to be dried are set onto the boat 1 by a non-illustrative loader. Particularly, the wafers 20 are set onto the boat 1 in such a way that the wafers 20 are vertical to the surface of the pure water 7 stored in the tank 2 and parallel to the dividing plates 5.

Figure 2A:
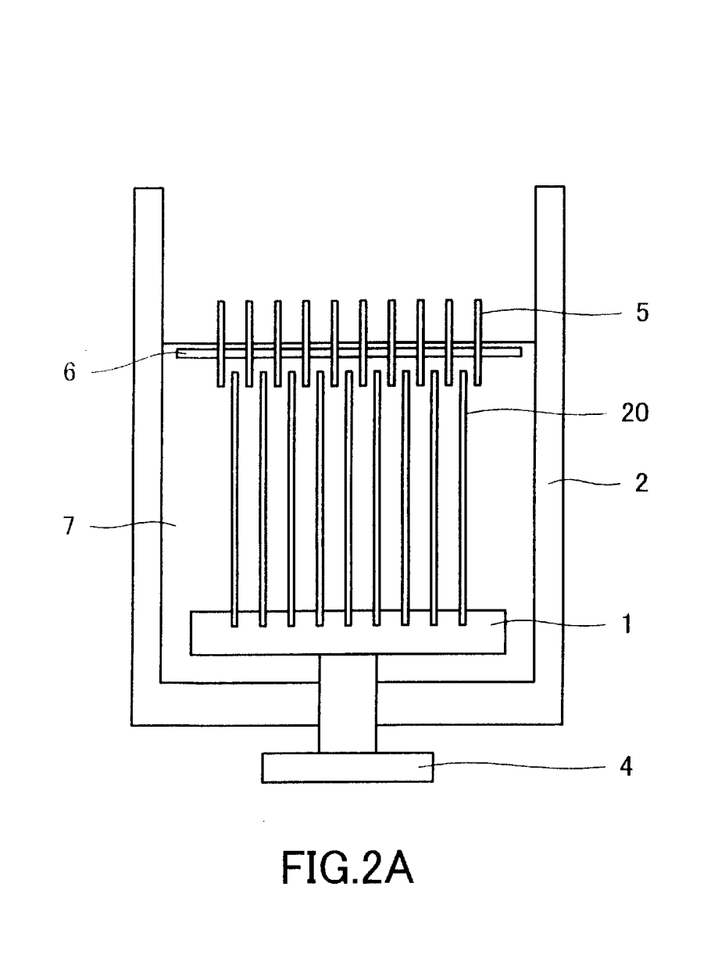
FIGS. 2A to 2D are diagrams each showing an operation of the drying apparatus of FIG. 1.

The lifter 4 lowers the boat 1 so as to let the wafers 20 completely soak in the pure water 7, as illustrated in FIG. 2A. As described above, the position of the surface 7A of the pure water 7 is set to correspond to the position where the dividing plates 5 are arranged.

Then, the tank 2 is closed with the lid 2A.

Figure 2B:
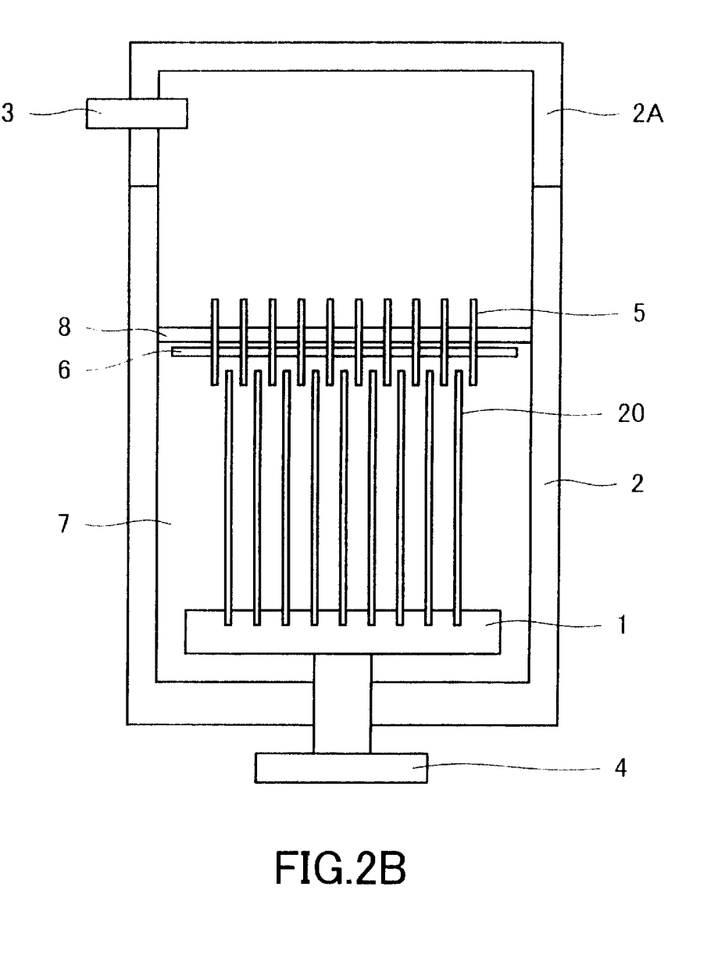

The vapor of the IPA is supplied together with the carrier gas from the supply nozzle 3 into the tank 2. This causes the IPA film 8 to be formed on the surface 7A of the pure water 7, as shown in FIG. 2B. The IPA film 8 is set to have a thickness on the order of a micron.

Figure 2C:
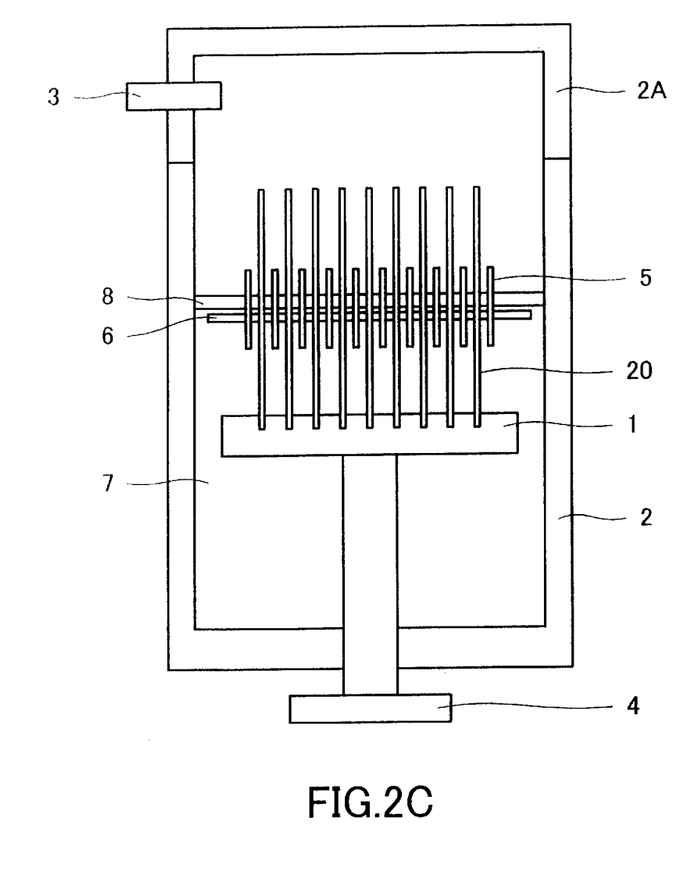

As illustrated in FIG. 2C, the lifter 4 lifts the wafers 20 without making the surface of the EPA film 8 waved. At this time, if the rate at which the lifter 4 lifts the wafers 20 is too low, it takes too much time to complete a process for drying the wafers 20. On the other hand, if the rate at which the lifter 4 lifts the wafers 20 is too high, the surface of the IPA film 8 waved. In this case, the impurities which have been removed from the wafers 20 are more likely to be adhered onto the wafers 20 again. In consideration of the above, it is preferred that the wafers 20 are lifted at a rate in a range of 1 to 3 mm/min.

Figure 3:
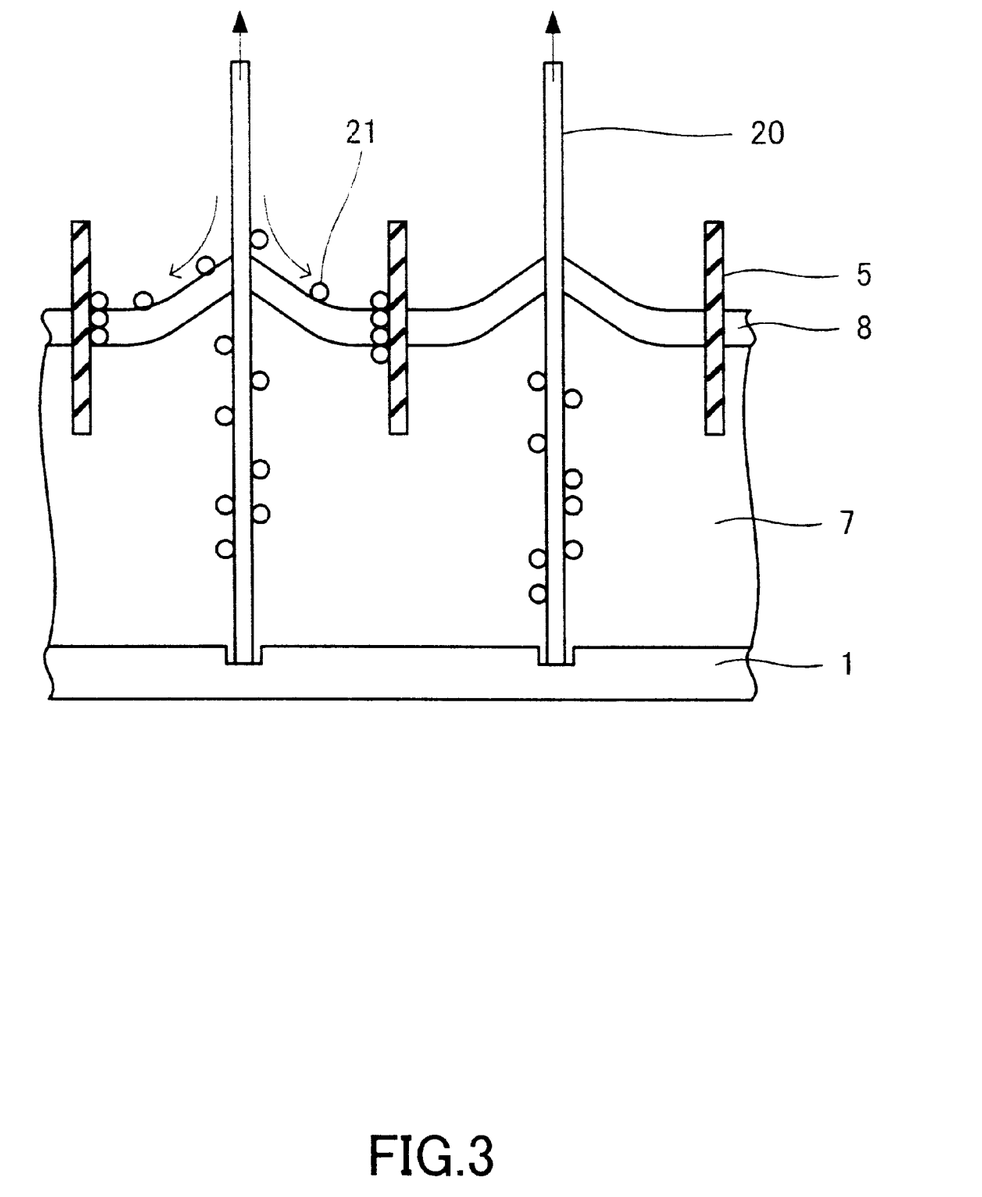
FIG. 3 is a diagram showing a function of dividers which are included in the drying apparatus of FIG. 1.

As illustrated in FIG. 3, when the wafers 20 just pass the IPA film 8 while being lifted, a flow in a direction shown with an arrow in the illustration occurs as a result of a Marangoni-flow effect. By the effect the flow, the moisture on the surface of the wafers 20 is removed therefrom. As a result of the above, the wafers 20 are dried.

Further, particles 21, etc. which are adhered onto the surface of the wafers 20 are removed therefrom together with the moisture. Any of those particles 21 which have been removed from the wafers 20 are trapped by the dividing plates 5 each arranged on every side of the wafers 20. Thus, the particles 21 which are trapped by a particular one of the dividing plates 5 can not reach the next one of the dividing plates 5.

Figure 2D:
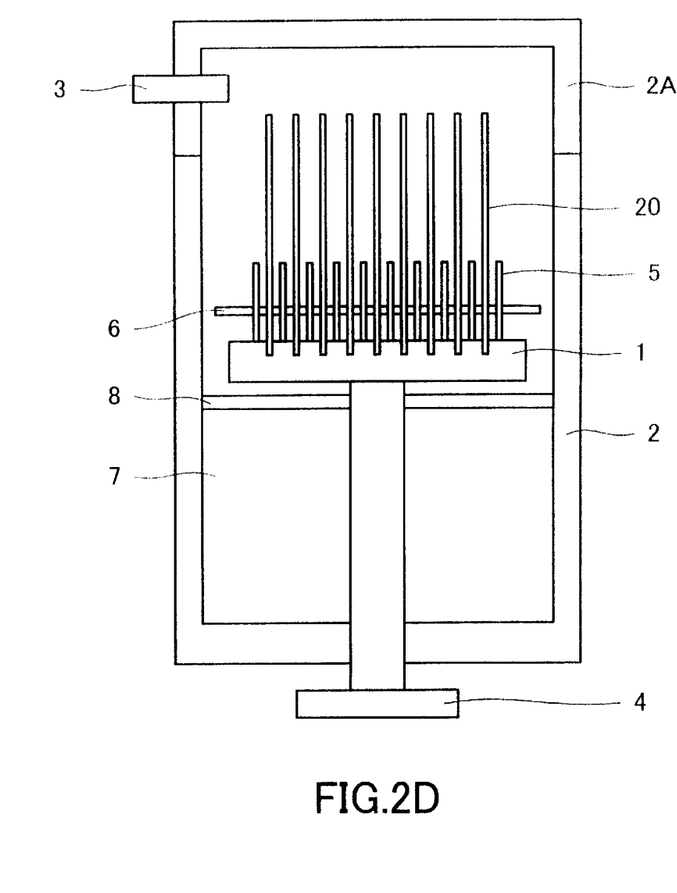

Once the wafers 20 are completely lifted up from the pure water 7, as illustrated in FIG. 2D, the EPA is no longer supplied to the tank 2.

The pure water 7 is discharged from a non-illustrative discharge tube. Thereafter, a dry gas such as heated nitrogen, etc. is supplied from the supply nozzle 3 into the tank 2. This causes the boat 1 and the internal wall of the tank 2 to be dried.

After the boat 1 and the internal wall of the tank 2 are completely dried, the lid 2A is opened, and the wafers 20 are unloaded from the tank 2 by an unloader (not illustrated).

Accordingly, the drying of the wafers 20 are completed.

The tank 2 and the dividing plates 5 are formed of or coated with a material, for example, polytetrafluoroethylene, etc. to which the particles 21 are unlikely to be adhered.

Figure 4:
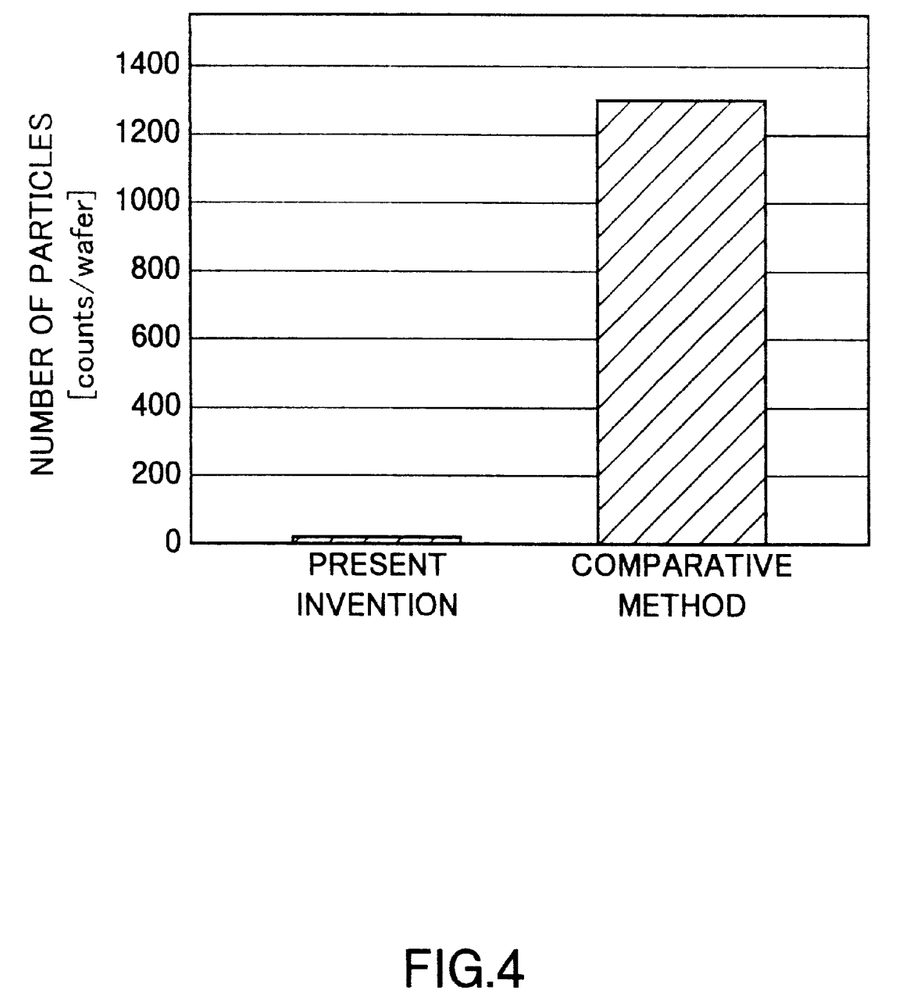
FIG. 4 is a graph showing the numbers of particles remaining on a semiconductor wafer after being dried, by using a drying apparatus of the present invention and a conventional drying apparatus, respectively.

FIG. 4 is a graph showing the number of particles 21 remaining on a semiconductor wafer after being dried by using a drying apparatus adopting the present invention. This number of particles 21 is compared with the number of particles 21 remaining on a semiconductor wafer after being dried by using a conventional drying apparatus which does not include the dividing plates 5.

As shown in FIG. 4, in the case of the conventional drying apparatus, more than a thousand particles 21 are adhered onto the wafers 20. On the contrary, in the case of the drying apparatus adopting this invention, the number of particles 21 adhered onto the wafers 20 is successfully held down approximately to twenty. As obvious from the above measurement results, having included the dividing plates 5 inside the tank 2, the wafers 20 are protected from the particles 21.

A drying apparatus according to the second embodiment of the present invention will now be explained with reference to the accompanying drawings.

Figure 5:
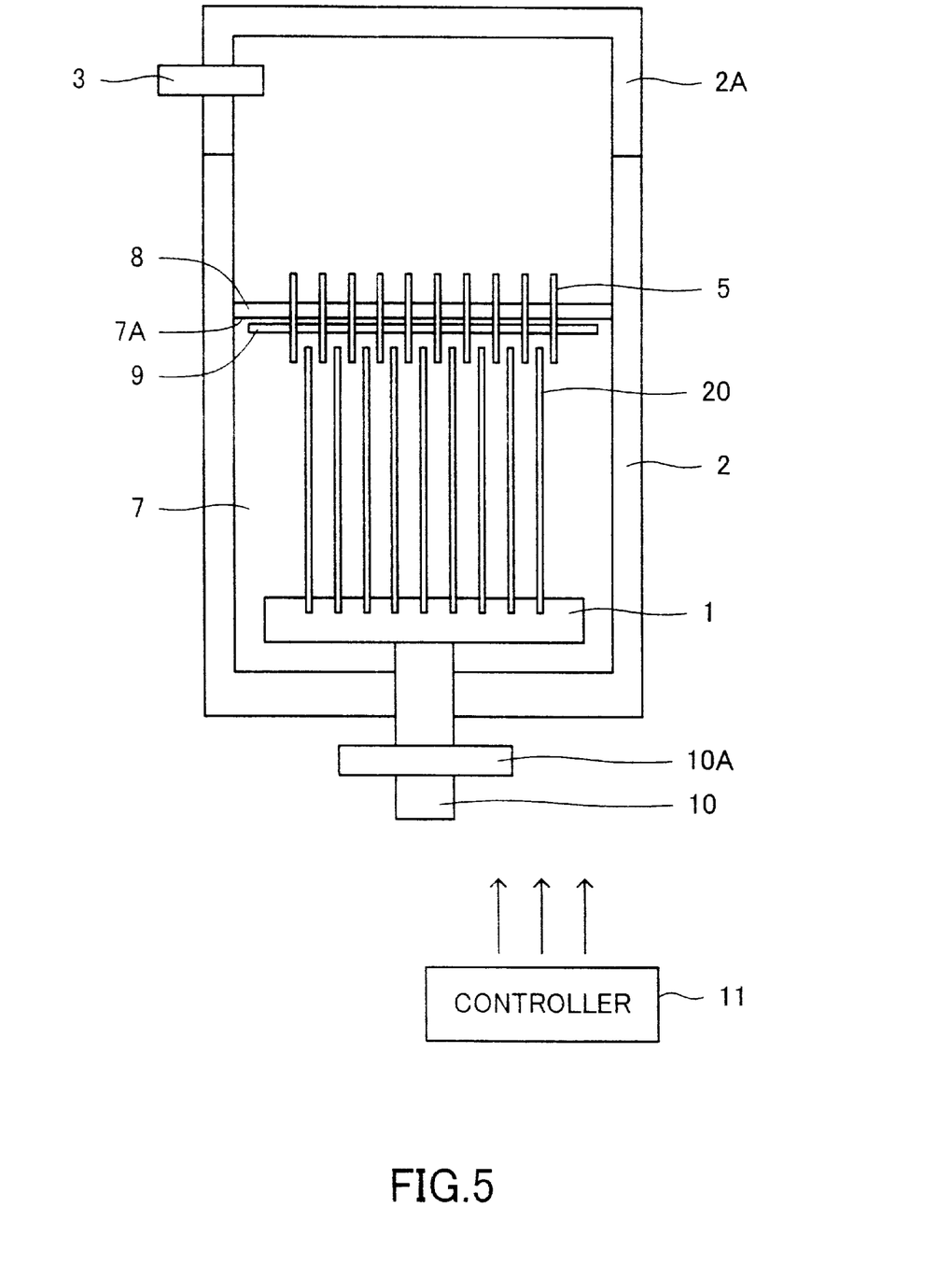
FIG. 5 is a diagram showing the structure of a drying apparatus according to the second embodiment of the present invention.

The drying apparatus according to the second embodiment comprises, as shown in FIG. 5, the boat 1, the tank 2, the supply nozzle 3, the dividing plates 5, the pole 9, a discharge tube 10, and the controller 11.

Figure 6A:
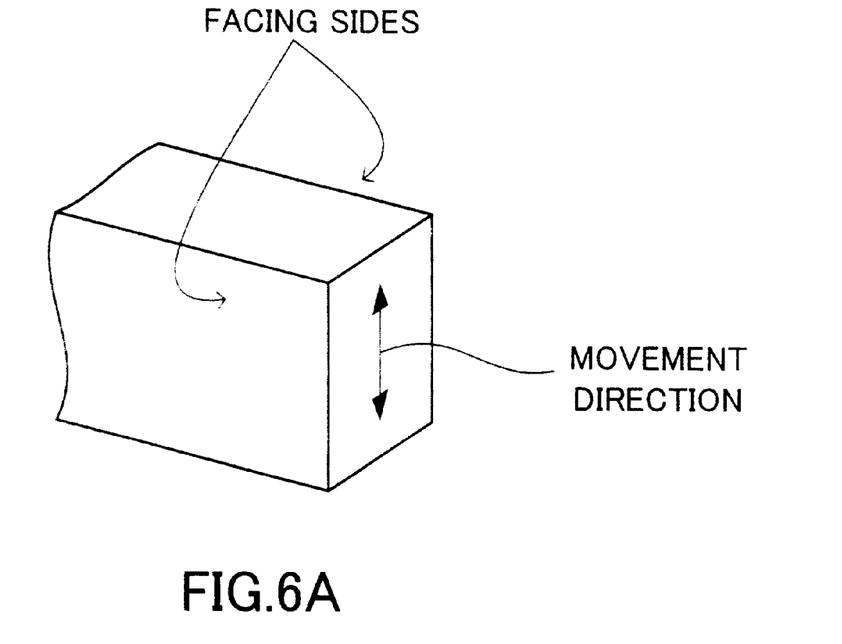
FIGS. 6A to 6B are diagrams each showing a shape of a terminal end of a pole included in the drying apparatus shown in FIG. 5.
Figure 6B:
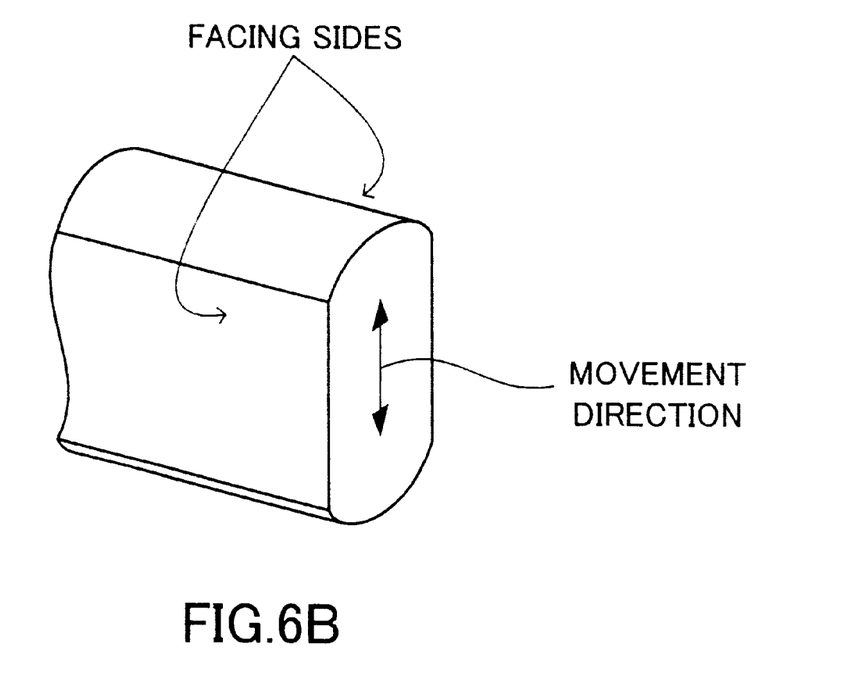

The pole 9 holds the dividing plates 5 without interfering with the movement of the boat 1 and the wafers 20. Both ends of the pole 9 are set into guide gaps which are formed on the side wall of the tank 2, so that the pole 9 can be moved upward and downward. As illustrated in FIGS. 6A and 6B, each end of the pole 9 set into the guide gaps has two sides which face each other in parallel with the movement direction of the pole 9. In this structure, the dividing plates 5 do not dramatically tilt.

The specific gravity of the pole 9 is set in such a way that the top end of each of the dividing plates 5 protrudes from the EPA film 8. In this structure, even if the surface 7A of the pure water 7 moves upward and downward, the surface of the EPA film 8 is securely divided by the dividing plates 5.

The discharge tube 10 includes a valve 10A, and is prepared so as to discharge the pure water 7 from the tank 2. The rate of the discharging can be adjusted by controlling the valve 10A. The drying apparatus of this embodiment has the same structure as the structure of the drying apparatus according to the first embodiment, except the pole 9 and the discharge tube 10.

Operations of the drying apparatus according to the second embodiment will now be explained.

Figure 7A:
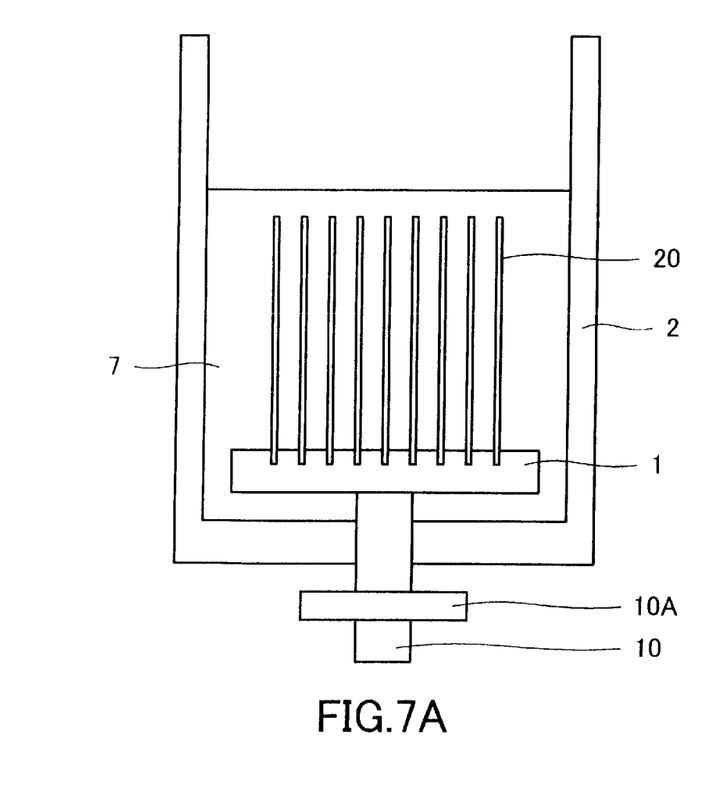
FIGS. 7A to 7D are diagrams each showing an operation of the drying apparatus shown in FIG. 5.

As shown in FIG. 7A, the boat 1 which holds the wafers 20 is soaked in the pure water 7, stored in the tank 2, by a non-illustrative loader. As a result of this, likewise the first embodiment, the target wafers 20 to be dried are completely soaked in the pure water 7.

Figure 7B:
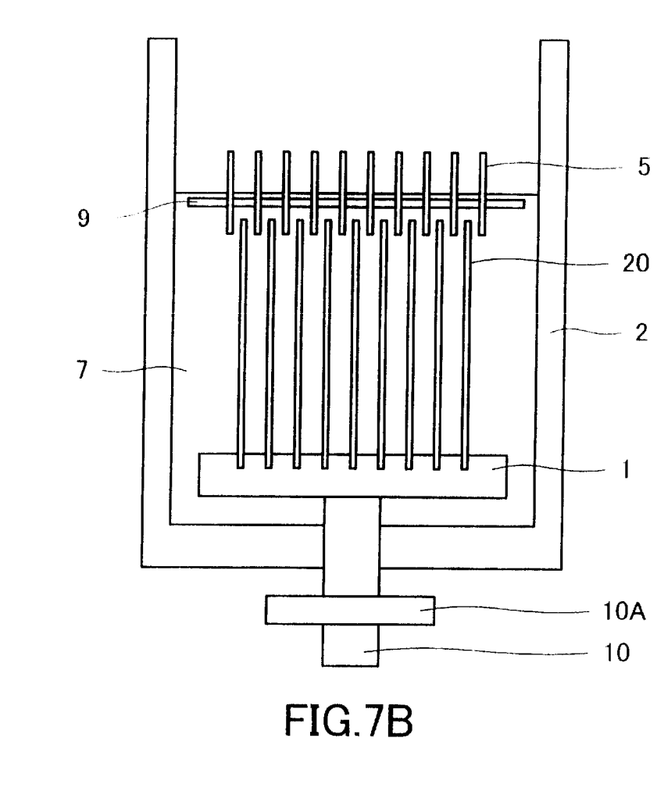

As shown in FIG. 7B, the pole 9 holding the dividing plates 5 is set into the guide gap.

The tank 2 is closed with the lid 2A.

Likewise in the first embodiment, in this embodiment, the vapor of the EPA is supplied form the nozzle 3 into the tank 2 together with a carrier gas, thereby to form the PA film 8 on the surface of the pure water 7.

As explained above, the specific gravity of the pole 9 is set in such a way that the top end of each of the dividing plates 5 protrudes from the IPA film 8. Hence, the surface of the IPA film 8 is divided by the dividing plates 5.

Figure 7C:
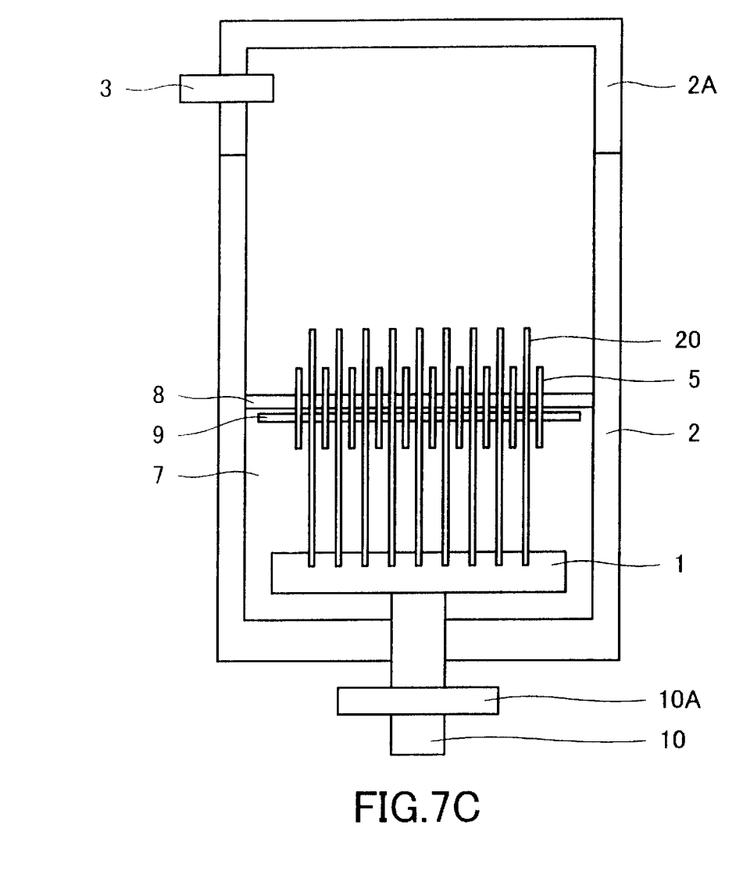

After this, as illustrated in FIG. 7C, the pure water 7 which is stored in the tank 2 is discharged from the discharge tube 10 without making the surface of the IPA film 8 waved. At this time, if the rate at which the pure water 7 is discharged is too low, it takes too much time to complete the drying of the waters 20. On the other hand, if the rate at which the pure water 7 is discharged is too high, the impurities removed from the wafers 20 are likely to be adhered thereonto again. It is, therefore, preferred that the pure water 7 is discharged in such a manner that the surface 7A of the pure water 7 moves downward at a rate of 1–3 mm/min by adjusting the valve 10A.

Having thus discharged the pure water 7, the wafers 20 are taken out from the pure water 7 through the IPA film 8. By the effect of the Marangoni-flow effect described in the first embodiment, the moisture on the surface of the wafers 20 is removed. Accordingly, the drying of the wafers 20 is achieved.

At this time, the particles 21, etc. which are adhered onto the surface of the wafers 20 are also removed together with the moisture. Because the pole 9 moves downward without causing the dividing plates 5 to tilt along with the downward movement of the surface 7A of the pure water 7, the particles 21 removed from the wafers 20 are trapped by one of the dividing plates 5, thus can not reach the next one of the dividing plates 5.

Figure 7D:
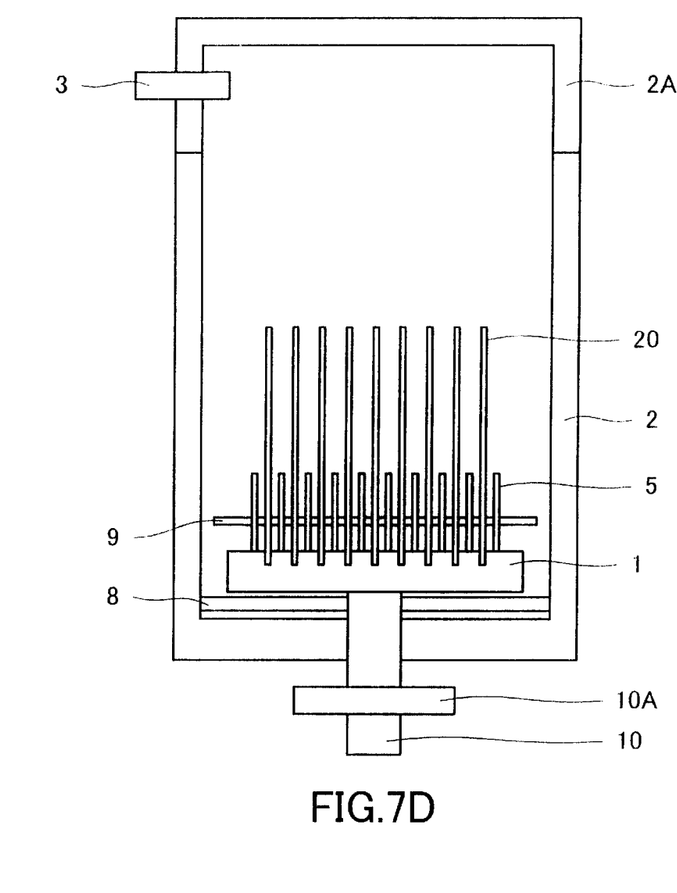

When the wafers 20 are entirely taken out from the pure water 7, as illustrated in FIG. 7D, the IPA is no longer supplied into the tank 2.

After the pure water 7 is completely discharged, the dry gas, such as heated nitrogen, etc. is supplied from the supply nozzle 3 into the tank 2. Then, the boat 1 and the internal wall of the tank 2 are dried.

After the boat 1 and the tank 2 are completely dried, the lid 2A is opened, and the wafers 20 are unloaded by an unloader (not illustrated).

Accordingly, the drying of the wafers 20 is accomplished.

As explained above, the drying apparatus according to the second embodiment of the present invention does not include any lifting mechanism, such as the lifter 4, etc. Accordingly, the structure of the drying apparatus of the second embodiment is simpler than that of the drying apparatus of the first embodiment.

It is not necessary that the dividing plates 5 are prepared in a range from one end to the other end of the tank 2, as long as the dividing plates 5 can prevent the particles 21 from being adhered onto the wafers 20 again. The length of each of the dividing plates 5 may be equal to the diameter of each wafer 20.

In the above-described embodiments, the pure water 7 on whose surface 7A the IPA film 8 is formed has been employed as a drying liquid for drying the wafers 20. However, any drying liquid other than the pure water 7 and the isopropyl alcohol may be used, if the employed liquid is not chemically reacted with the wafers 20, and if the above-described Marangoni-flow effect can occur.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2000-108490 filed on Apr. 10, 2000, and including specification, claims, drawings and summary. The disclosure of the above Japanese Patent Application is incorporated herein by reference in its entirety.

What is claimed is:

1. A drying apparatus comprising:
    a tank which stores a drying liquid for drying a target semiconductor wafer to be dried;
    a holder which holds the semiconductor wafer, perpendicular to a surface of the drying liquid;
    a dryer which soaks the semiconductor wafer in the drying liquid, and removes the semiconductor wafer from the drying liquid, thereby to dry the semiconductor wafer; and
    a divider which divides the surface of the drying liquid on each side of the semiconductor wafer, thereby to protect an impurity removed from the semiconductor wafer from again adhering to the semiconductor wafer.

2. The drying apparatus according to claim 1, wherein said dryer lifts and lowers said holder, thereby to soak and takes out the semiconductor wafer in and from the drying liquid.

3. The drying apparatus according to claim 2, wherein said dryer lifts said holder at a rate in a range from 1 to 3 mm/min.

4. The drying apparatus according to claim 2, wherein said divider includes a plurality of plates, each of which is formed of polytetrafluoroethylene, for dividing the surface of the drying liquid.

5. The drying apparatus according to claim 1, wherein:
    said dryer discharges the drying liquid from said tank so as to take out the semiconductor wafer from the drying liquid; and
    said divider floats on the drying liquid, and moves downward along with a downward movement of the surface of the drying liquid.

6. The drying apparatus according to claim 5, wherein:
    said divider comprises at least one plate for dividing the surface of the drying liquid and a holding member for holding the at least one plate; and
    said holding member has such specific gravity that a top end of the at least one plate protrudes from the drying liquid.

7. The drying apparatus according to claim 6, wherein said dryer includes a valve for adjusting a discharge amount of the drying liquid to be discharged, and lowers the surface of the drying liquid at a rate in a range from 1 to 3 mm/min.

8. The drying apparatus according to claim 6, wherein the at least one plate is formed of polytetrafluoroethylene.

9. A method for drying an object, comprising:
    soaking a semiconductor wafer, perpendicular to a surface of a drying liquid, in the drying liquid which is stored in a tank and for drying the semiconductor wafer;
    drying the semiconductor wafer by removing the semiconductor wafer from the drying liquid; and
    preventing particles, which are removed once from the semiconductor wafer, from being again adhered onto the semiconductor wafer, by dividing the surface of the drying liquid at each side of the semiconductor wafer when removing the semiconductor wafer from the drying liquid.

10. The method according to claim 9, wherein said drying includes removing the semiconductor wafer from the drying liquid by lifting the semiconductor wafer.

11. The method according to claim 10, wherein said drying includes lifting the semiconductor wafer at a rate in a range from 1 to 3 mm/min.

12. The method according to claim 9, wherein:
    said drying includes removing the semiconductor wafer from the drying liquid, by discharging the drying liquid from the tank; and
    said preventing includes dividing the surface of the drying liquid with at least one plate, which moves downward along with a downward movement of the surface of the drying liquid.

13. The method according to claim 12, wherein said drying includes lowering the surface of the drying liquid at a rate in a range from 1 to 3 mm/min, by adjusting a discharge amount of the drying liquid.

* * * * *